United States Patent
Allen et al.

(10) Patent No.: US 8,029,971 B2
(45) Date of Patent: Oct. 4, 2011

(54) PHOTOPATTERNABLE DIELECTRIC MATERIALS FOR BEOL APPLICATIONS AND METHODS FOR USE

(75) Inventors: Robert D. Allen, San Jose, CA (US); Phillip Joe Brock, Sunnyvale, CA (US); Blake W. Davis, Hollister, CA (US); Qinghuang Lin, Yorktown Heights, NY (US); Robert D. Miller, San Jose, CA (US); Alshakim Nelson, Fremont, CA (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 610 days.

(21) Appl. No.: 12/047,435

(22) Filed: Mar. 13, 2008

(65) Prior Publication Data
US 2009/0233226 A1 Sep. 17, 2009

(51) Int. Cl.
- G03F 7/039 (2006.01)
- G03F 7/20 (2006.01)
- G03F 7/30 (2006.01)
- G03F 7/40 (2006.01)
- G03F 7/38 (2006.01)

(52) U.S. Cl. ............ 430/270.1; 430/326; 430/328; 430/330; 430/905; 430/914; 430/919; 430/921; 430/925

(58) Field of Classification Search ............ None
See application file for complete search history.

(56) References Cited

U.S. PATENT DOCUMENTS

| | | | |
|---|---|---|---|
| 5,691,396 A | 11/1997 | Takemura et al. | |
| 5,886,102 A | 3/1999 | Sinta et al. | |
| 5,939,236 A | 8/1999 | Pavelchek et al. | |
| 6,080,526 A | 6/2000 | Yang et al. | |
| 6,087,064 A | 7/2000 | Lin et al. | |
| 6,420,084 B1 | 7/2002 | Angelopoulos et al. | |
| 6,667,147 B2 | 12/2003 | Gallagher et al. | |
| 6,803,171 B2 | 10/2004 | Gronbeck et al. | |
| 7,041,748 B2 | 5/2006 | Lin et al. | |
| 7,056,840 B2 | 6/2006 | Miller et al. | |
| 7,072,563 B2 | 7/2006 | Shelnut et al. | |
| 7,189,490 B2 | 3/2007 | Kanagasabapathy et al. | |
| 7,306,853 B2 | 12/2007 | Lin et al. | |
| 2002/0042020 A1 | 4/2002 | Gallagher et al. | |
| 2003/0059723 A1 | 3/2003 | Gallagher et al. | |
| 2004/0012089 A1 | 1/2004 | Rantala et al. | |
| 2004/0229050 A1 | 11/2004 | Li et al. | |

*Primary Examiner* — Sin J. Lee
(74) *Attorney, Agent, or Firm* — Schmeiser, Olsen & Watts

(57) ABSTRACT

Compositions, a method, and a photopatternable blend. The compositions include a blend of a first and a second polymer. The first polymer is a substituted silsesquioxane copolymer. The second polymer is a substituted silsesquioxane polymer. The second polymer is configured to undergo chemical crosslinking with the first polymer, the second polymer, or a combination thereof, upon exposure to light, thermal energy, or a combination thereof. The compositions include a photosensitive acid generator. The method includes forming a film. The film is patternwise imaged, and at least one region is exposed to radiation. After the imaging, the film is baked, wherein at least one exposed region is rendered substantially soluble. After the baking, the film is developed, wherein a relief pattern remains. The relief pattern is exposed to radiation. The relief pattern is baked. The relief pattern is cured. A chemically amplified positive-tone photopatternable blend is also described.

24 Claims, 2 Drawing Sheets

PHOTOPATTERNABLE DIELECTRIC MATERIALS FOR BEOL APPLICATIONS AND METHODS FOR USE

FIELD OF THE INVENTION

The invention relates generally to on-chip electrical insulators used in integrated circuits, and more specifically, silicon-containing polymer blends as photopatternable dielectric materials.

BACKGROUND OF THE INVENTION

The continuous shrinking in dimensions of electronic devices utilized in ultra-large scale semiconductor integrated (ULSI) circuits in recent years has resulted in increasing the resistance of the back-end-of-the-line (BEOL) metallization without concomitantly decreasing the interconnect capacitances. Interconnects may be scaled to higher aspect ratios (a height to width ratio of typically greater than 3:1) to mitigate the resistance increases, which may lead to increased capacitances. This combined effect may increase signal delays in ULSI electronic devices.

The materials may be patterned by several patterning and sacrificial masking materials which may include photoresist polymers, via fill materials. Following the lithographic patterning of the masking layer, a series of etching steps may be employed to transfer the pattern from the photoresist to each of the layers underneath, including the insulating layer. The patterning of insulating materials may require as many as seven layers, some of which may be removed after patterning, resulting in a complex and inefficient process.

It would thus be highly desirable to provide a material which can reduce the integration complexity and processing steps required, and does not require costly photoresist polymers and/or significantly reduces etching processes.

SUMMARY OF THE INVENTION

The present invention relates to a composition comprising:

a polymer blend comprising a first polymer and a second polymer, wherein said first polymer is described by the general formula:

$$\left[\begin{array}{c}R^1\\|\\SiO_{1.5}\end{array}\right]_m \left[\begin{array}{c}R^2\\|\\SiO_{1.5}\end{array}\right]_n \left[\begin{array}{c}R^3\\|\\SiO_{1.5}\end{array}\right]_p$$

wherein, m and p are integers greater than zero, n is an integer greater than or equal to zero, $R^1$ is a carbon functionality having an acid-labile protecting group, $R^3$ is a carbon functionality having at least one carbon atom, wherein $R^2$ is selected from the group consisting of

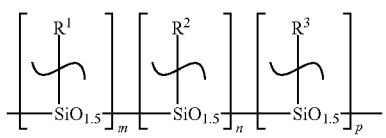

-continued

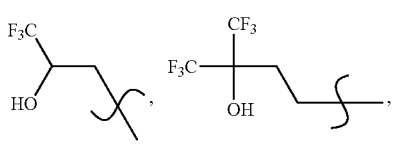

and wherein said second polymer is described by the general formula:

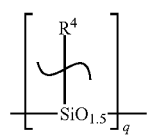

wherein, q is an integer greater than zero and $R^4$ is a carbon functional group comprising at least one carbon atom, wherein said second polymer is configured to undergo chemical crosslinking with said first polymer, said second polymer, or a combination thereof, upon exposure to light, thermal energy, or a combination thereof; and a photosensitive acid generator.

The present invention relates to a composition, comprising:

a polymer blend comprising a first silsesquioxane polymer and a second silsesquioxane polymer, wherein said first silsesquioxane polymer is described by the general formula:

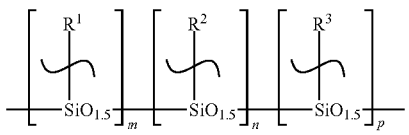

wherein, m, n, and p are integers in a range from 1 to about 5,000, $R^1$ is

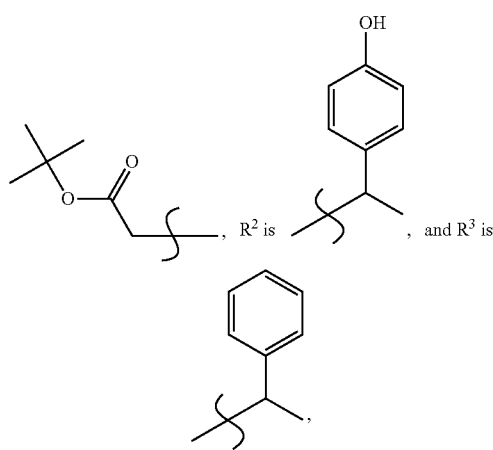

, $R^2$ is , and $R^3$ is , wherein said second silsesquioxane polymer is described by the general formula:

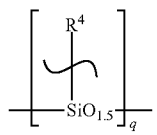

where q is an integer in a range from about 4 to about 50,000, and where $R^4$ is a methyl group, wherein said second polymer is configured to undergo chemical crosslinking with said first polymer, said second polymer, or a combination thereof, upon exposure to light, thermal energy, or a combination thereof;
  an organic base; and
  a photosensitive acid generator.

The present invention relates to a chemically amplified positive-tone photopatternable blend comprising:
  at least two different polymers mixed together, wherein in combination said at least two different polymers are capable of being positively imaged resulting in forming a relief pattern capable of being hardened via crosslinking.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Figure 1:
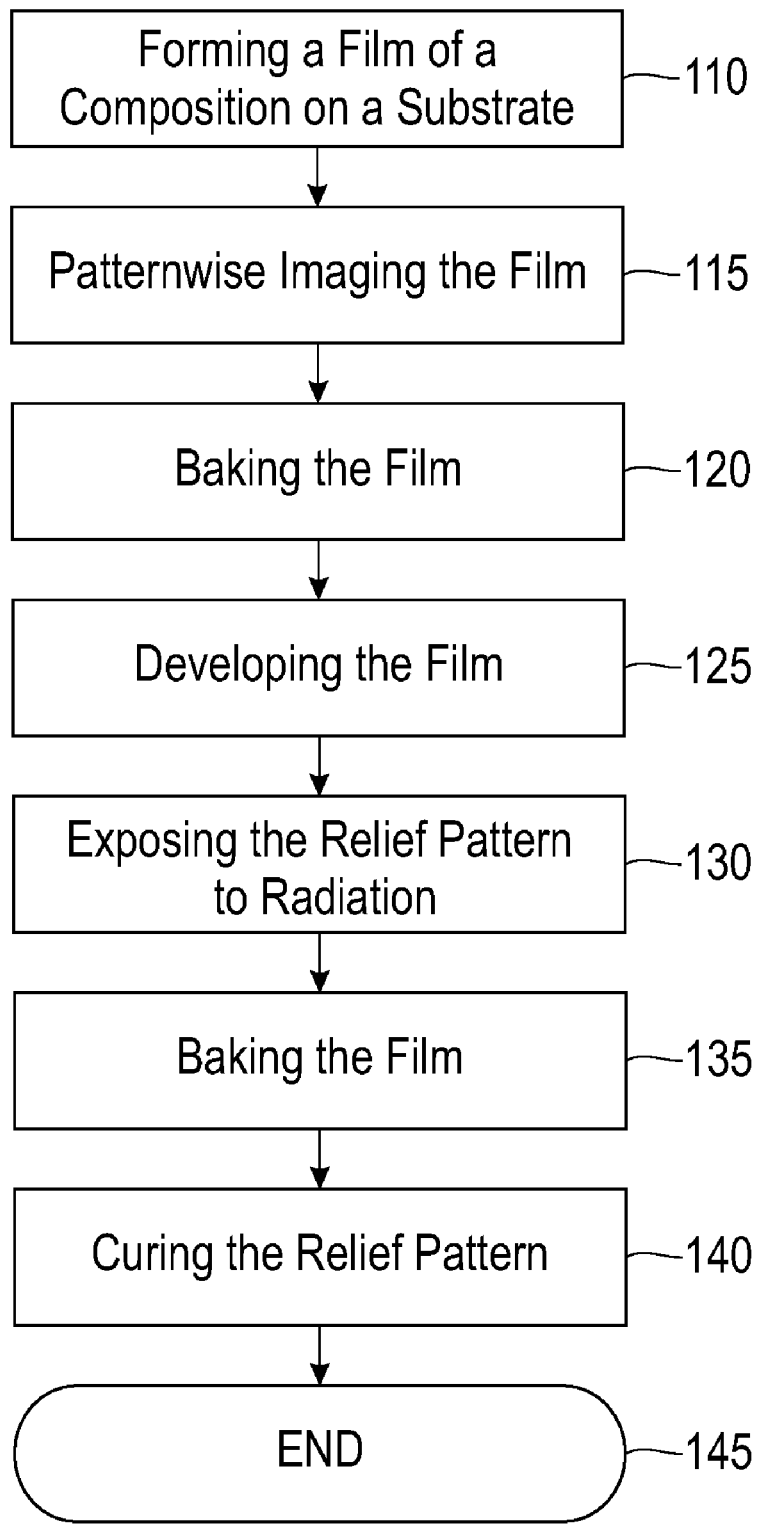
FIG. 1 is a flow chart illustrating a method for preparing a relief pattern on a substrate, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

Described herein are various embodiments of a polymer blend comprised of two or more different polymers mixed together as a low-k photopatternable composition. The term "low-k" denotes a dielectric material having a dielectric constant (k) that is less than 3.0. Unless otherwise specified the dielectric constants mentioned herein are measured relative to that of vacuum. The composition of the polymer blend may be such that the fidelity of the patterns generated can be maintained throughout subsequent processing temperatures compatible with BEOL requirements.

The polymers in combination may be positively imaged to form a pattern which can then be hardened or cured via crosslinking. The crosslinking may occur thermally at temperatures above temperatures used in the imaging process. The composition may, for example, be a chemically amplified, positive-tone photoresist. The composition of the polymer blend may be such that the composition has a k value less than 3.0 after curing above 400° C.

The composition may be used for on-chip electrical insulators and for forming relief patterns for on-chip interconnect structures such as those used in integrated circuits, for example.

At least one of the polymers of the blend may provide control over the rate of dissolution of the polymer blend into aqueous base. For example, the dissolution-controlling polymer may comprise at least one repeating unit having at least one carbon functionality, such as linear or branched alkyls, cylcoalkyls, aromatics, arenes, acrylates, or combinations thereof, for example. The structure (e.g., size, chain length, etc.) of the carbon functionality controls the dissolution rate into aqueous base. Blending of the dissolution-controlling polymer with at least one other base-soluble polymer allows properties such as dissolution rate and aqueous base solubility to be appropriately adjusted.

At least one of the polymers of the blend may contain silicon. For example, the blend may comprise at least two silsesquioxane polymers. At least one of the polymers of the blend may comprise a silanol or a silyl ether. At least one of the polymers of the blend may comprise a base-soluble silicon-containing polymer which may possess acid-sensitive functional groups (such as silanol end groups, for example) which may undergo condensation reactions in the presence of acid to form Si—O—Si bonds. In one embodiment, the blend composition may comprise at least two aqueous base soluble, silicon-containing polymers. The silicon-containing polymers described herein may comprise organosilicates, silsesquioxanes, siloxane, and the like, and may be soluble in aqueous base or organic solvents. The silsesquioxane polymers described herein may undergo chemical crosslinking, including photoacid-catalyzed crosslinking, thermally induced crosslinking, or a combination of these, such as condensation reactions of silanol end groups, for example.

The composition may comprise a polymer blend of silsesquioxane polymers. The polymers in the blend may be miscible with each other. The first silsesquioxane polymer may be linear, branched, caged compound or combinations thereof having the following general structural formula:

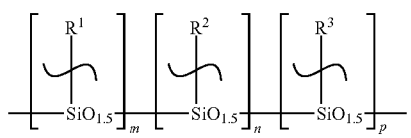

where, m, n, and p represent the number of each of the repeating units, $R^1$ represents a carbon functionality (the carbon functionality comprising at least one carbon atom) having an acid-labile protecting group, $R^2$ represents a group which may comprise one or more functional groups which provide polymer solubility in aqueous base, and $R^3$ represents a group which may comprise a carbon functionality comprising at least one carbon atom, where the carbon functionality controls polymer dissolution of the polymer blend into aqueous base. $R^1$, $R^2$, and $R^3$ may be non-identical groups. Subscripts m, n, and p represent the number of repeating units. Subscripts m and p may be integers greater than zero. For example m and p may each independently be in a range from 1 to about 5,000. Subscript n may be an integer greater than or equal to zero. For example, n may be an integer in a range from 0 to about 5,000.

$R^1$ is not limited to any specific carbon functional group, and may be selected from among conventional acid sensitive protecting groups, such as carbonates, tertiary esters, acetals, ketals, the like, and combinations thereof. For example, the acid sensitive protecting group may comprise a tert-butylacetate group, where $R^1$ may be:

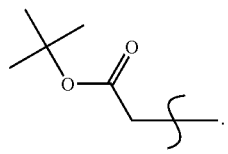

$R^2$ is not limited to any specific functional group, and may comprise functional groups which are substituted with —OH groups, —C(O)OH groups, —F, or combinations thereof. $R^2$ may comprise linear or branched alkyls, cycloalkyls, aromatics, arenes, or acrylics. For example, $R^2$ may be

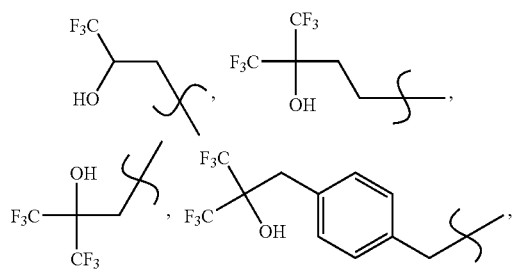

-continued

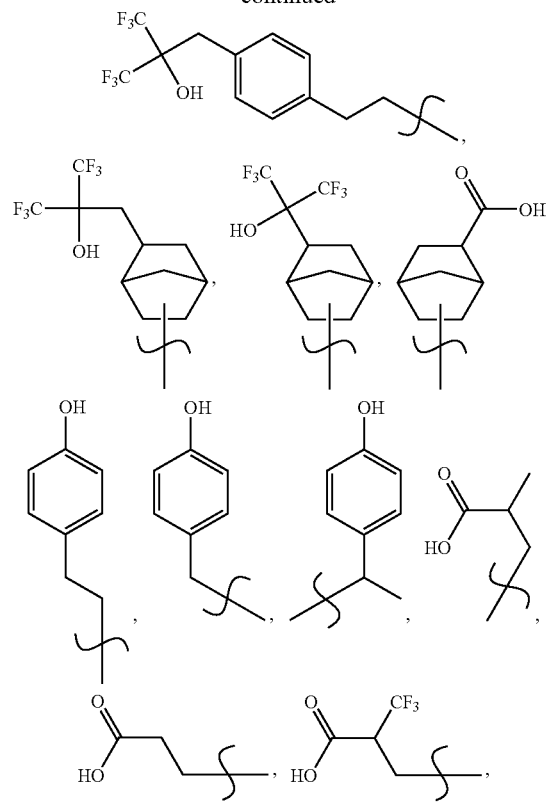

or the like.

$R^3$ is not necessarily limited to any specific functional group, and may comprise linear or branched alkyls, cylcoalkyls, aromatics, arenes, acrylates, or combinations thereof. For example $R^3$ may be:

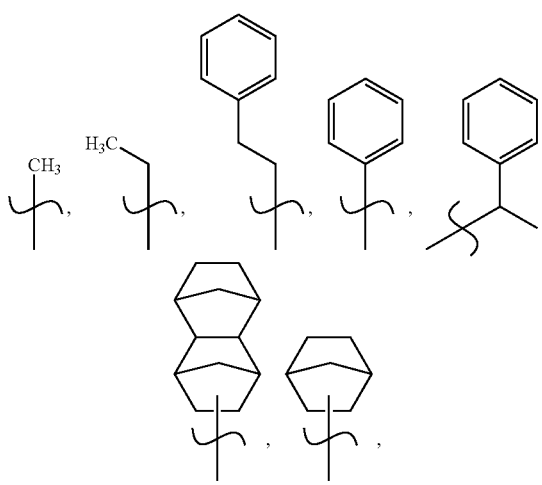

or the like.

The specific proportions and structures of $R^1$, $R^2$, and $R^3$ may be selected to provide a material suitable for photolithographic patterning processes.

The second silsesquioxane polymer may comprise a polymer having the structural formula:

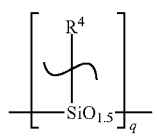

where $R^4$ may be a carbon functional group having at least one carbon atom and wherein the subscript q represents the number of repeating units and may be an integer greater than zero. The subscript q may be in a range from about 4 to about 50,000, such as from about 10 to about 1,000 for example. $R^4$ may comprise, for example, alkyls, cycloalkyls, aryl, or combinations thereof. Examples of $R^4$ include:

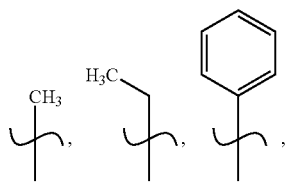

or the like.

In one embodiment, the second silsesquioxane polymer may be poly(methylsilsesquioxane), where $R^4$ is a methyl group, and q is an integer from about 4 to about 1,000. In another embodiment, q may be greater than 1,000. The second silsesquioxane polymer may comprise a copolymer. The second silsesquioxane polymer structure may be caged, linear, branched, or combinations thereof. The silsesquioxane polymers of the present invention may comprise end groups comprising silanols, halosilanes, acetoxysilanes, silylamines, alkoxysilanes, and combinations thereof, which may undergo condensation reactions in the presence of an acid generated by a photoacid generator under exposure to radiation, followed by thermal baking. Polymer molecules of the second polymer may undergo chemical crosslinking with molecules of the first polymer, the second polymer, or a combination of these. In one embodiment of the present invention, the second silsesquioxane may be the silsesquioxane polymer LKD 2021 or LKD-2056 (products of JSR Corporation) which contains silanol end groups.

The silsesquioxane polymers in the polymer blend may have a weight averaged molecular weight in the range from about 400 to about 500,000 g/mol, such as from about 1500 to about 10,000 g/mol, for example.

The composition comprising the polymer blend may further comprise a photosensitive acid generator (PAG) blended with the two blended polymers, where the PAG generates an acid upon exposure to radiation. The photosensitive acid generator may be miscible with the two polymers. Examples of some PAGs may comprise: (trifluoro-methylsulfonyloxy)-bicyclo[2.2.1]hept-5-ene-2,3-dicarboximide (MDT), N-hydroxy-naphthalimide (DDSN), onium salts, aromatic diazonium salts, sulfonium salts, diaryliodonium salts, and sulfonic acid esters of N-hydroxyamides, imides, or combinations thereof.

The concentrations of each of the silsesquioxane polymers in the blend formulation may be from about 1% to about 99% weight/weight (w/w) of the total polymer composition. For example, the concentration of the second silsesquioxane polymer may be from about 5% to about 95% w/w of the total polymer composition. In one embodiment of the invention, the concentration of the acid sensitive polymer may be about 20% to about 80% w/w of the total polymer composition. In another embodiment, the composition of the acid sensitive polymer may be about 30% to about 60% w/w of the total polymer composition. In another embodiment, each of the polymers in the blend constitutes at least 5% w/w of the blend.

The composition may further comprise a thermal acid generator (TAG) which generates an acid upon thermal treatment. Examples of suitable TAGs include 2,4,4,6-tetrabromocyclohexadienone, benzoin tosylate, 2-nitrobenzyl tosylate and other alkyl esters of organic sulfonic acids, blocked alkyl phosphoric acids, blocked perfluoroalkyl sulfonic acids, alkyl phosphoric acid/amine complexes, and perfluoroalkyl acids, wherein the blocking can be by covalent bonds, amine and quaternary ammonium. Other examples include compounds that generate a sulfonic acid upon thermal activation. The compositions described herein are not limited to any specific selection of TAG.

In optimizing the photolithography process, the composition may further comprise an organic base. The organic base may be any suitable base known in the resist art. Examples of organic bases include tetraalkylammonium hydroxides, cetyltrimethylammonium hydroxide, 1,8-diaminonaphthalene, or a combination of these The compositions described herein are not limited to any specific selection of organic base.

The composition may further comprise a suitable casting solvent to dissolve the other components. The casting solvent may be used to prepare a film of the composition. Suitable casting solvents may comprise solvents such as ethoxyethylpropionate (EEP), a combination of EEP and γ-butyrolactone, propylene-glycol monomethylether alcohol and acetate, propyleneglycol monopropyl alcohol and acetate, ethyl lactate, or combinations thereof.

FIG. 1 is a flow chart illustrating a method for preparing a relief pattern on a substrate. In step 110, a film of a photoresist composition is formed on a substrate, where the composition may be a blend of two silicon containing polymers and a photosensitive acid generator such as described above. The film may be formed by processes such as spin coating, spray coating, dip coating, doctor-blading, and the like, which may be used individually and in combinations thereof in accordance with the methods of the present invention.

The substrate may comprise multiple layers or the substrate may comprise a single layer. The substrate may have silica and silicon nitride disposed thereon, such as in the form of layers, for example. The substrate may consist essentially of silica and silicon nitride. The substrate may include a semiconducting material, an insulating material, a conductive material or any combination thereof, including multilayered structures. Thus, for example, the substrate may comprise a semiconducting material such as Si, SiGe, SiGeC, SiC, GaAs, InAs, InP and other III/V or II/VI compound semiconductors. The substrate may comprise, for example, a silicon wafer or process wafer such as that produced in various steps of a semiconductor manufacturing process, such as an integrated semiconductor wafer. The substrate may comprise a layered substrate such as, for example, Si/SiGe, Si/SiC, silicon-on-insulators (SOIs) or silicon germanium-on-insulators (SGOIs). The substrate may comprise layers such as a dielectric layer, a barrier layer for copper such as SiC, a metal layer such as copper, a silicon layer, a silicon oxide layer, the like, or combinations thereof. The substrate may comprise an insulating material such as an organic insulator, an inorganic insulator or a combination thereof including multilayers. The substrate may comprise a conductive material, for example, polycrystalline silicon (polySi), an elemental metal, alloys of elemental metals, a metal silicide, a metal nitride, or combinations thereof, including multilayers. The substrate may comprise ion implanted areas, such as ion implanted source/drain areas having P-type or N-type diffusions active to the surface of the substrate.

In some embodiments, the substrate may include a combination of a semiconducting material and an insulating material, a combination of a semiconducting material and a conductive material or a combination of a semiconducting material, an insulating material and a conductive material. An example of a substrate that includes a combination of the above is an interconnect structure.

In step 115, the photoresist film is patternwise imaged using a radiation source, resulting in the photosensitive acid generator producing an acid catalyst in the exposed regions of the film.

Figure 2:
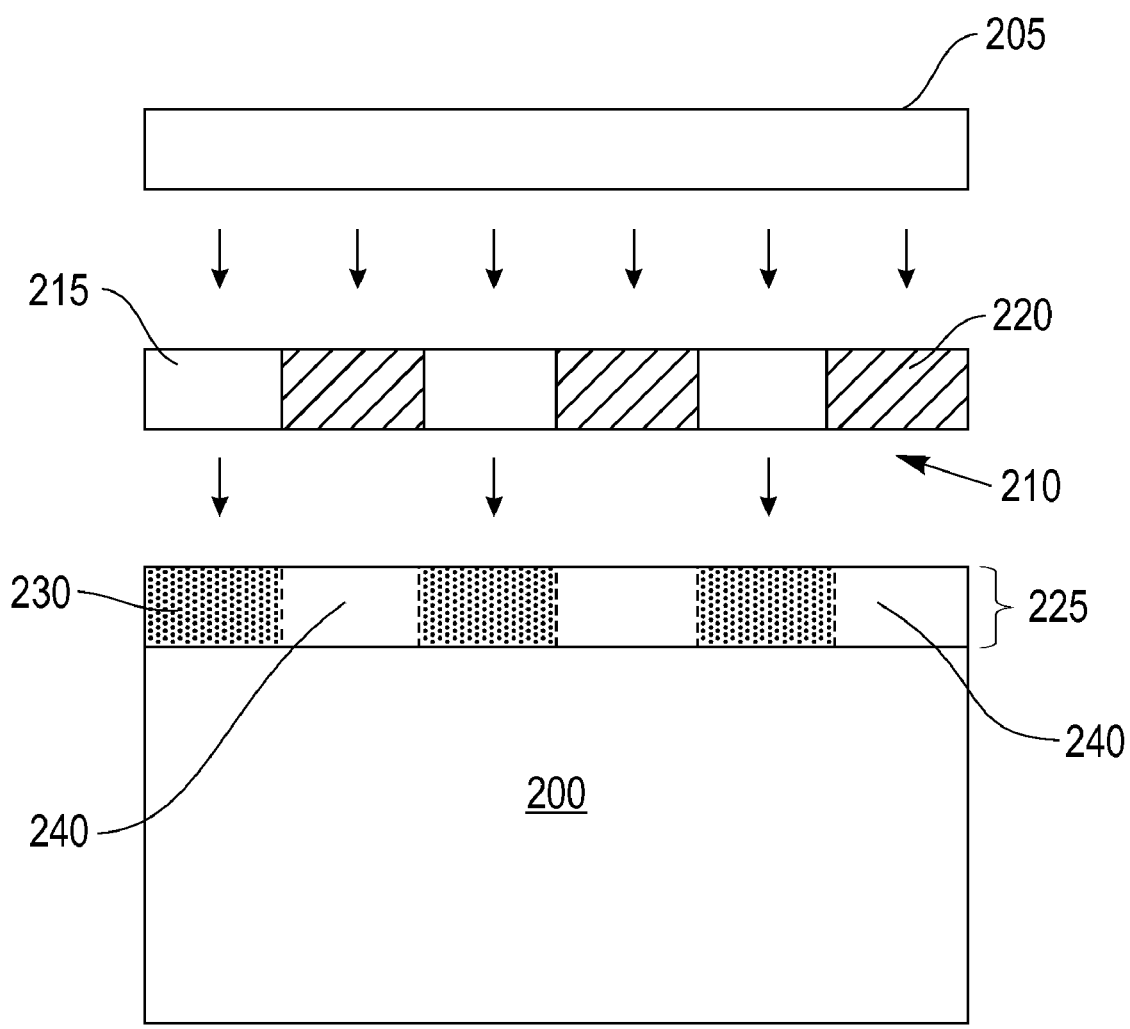
FIG. 2 is an illustration of patternwise imaging a photoresist film, in accordance with embodiments of the present invention.

FIG. 2 is an illustration of patternwise imaging a photoresist film 225, wherein a radiation source 205 projects radiation through a patterned mask 210 onto the film 225 disposed on a substrate 200. The mask may have a pattern of masked sections 220 which are essentially opaque to the radiation, and unmasked sections 215 which are essentially transparent to the radiation. Radiation passing through the unmasked sections 215 may be transmitted to the film 225 to be absorbed in the exposed regions 230 of the film 225, wherein the radiation may induce the production of an acid catalyst in the exposed regions 230 of the film 225. Unexposed regions 240 may not produce an acid catalyst. The pattern of exposed regions 230 and unexposed regions 240 may form a latent pattern in the film 225. For a positive-tone resist composition, exposure to the radiation (such as ultraviolet (UV) light at a wavelength from about 12 nm to about 1000 nm, electron beam radiation, plasma, etc.) followed by a post exposure bake may render the exposed regions 230 substantially soluble in a developer.

The term substantially soluble, as used herein, is intended to comprise having a high enough degree of solubility in aqueous base solutions or solvents so to allow all or almost all (i.e., any remaining material is present such a small amounts so as to not interfere with subsequent processing steps) of the material (e.g., polymer, photoresist, etc.) in regions containing acid derived from the photosensitive acid generator to dissolve into aqueous base solutions or photoresist solvents. The term substantially insoluble, as used herein, is intended to comprise having such a small degree of solubility so as to not affect the quality of an image formed from a photoresist by loss of material (e.g., polymer, photoresist, etc.) through dissolution into aqueous base solution or photoresist solvents from regions of the photoresist layer not containing photosensitive acid generator derived acid. In the context of photoresist formulation and semiconductor processing, the term substantially insoluble is intended to include polymers completely or almost completely insoluble in photoresist solvents. In the context of photoresist formulation and semiconductor processing, the term substantially soluble is intended to include polymers completely or almost completely soluble in photoresist solvents. In general, the polymer dissolution rates affect the dissolution rates of the photoresist layers most strongly; thus, a substantially insoluble polymer may render substantially insoluble a photoresist comprising that polymer. Substantially insoluble photoresists have a dissolution rate of less than about 0.2 nanometers/second (nm/s) in solvent or aqueous base, while substantially soluble photoresists have a dissolution rate of greater than about 5 nm/s in solvent or aqueous base. Photoacid generators, quencher and other additives may also alter the dissolution rates of the final photoresist layer.

The photoresists, films, and relief patterns described herein may be patternwise imaged or otherwise exposed to radiation using radiation such as ultraviolet (UV), such as radiation having wavelengths of approximately 436 nanometers (nm) and 365 nm, deep-ultraviolet (DUV) such as wavelengths of approximately 257 nm, 248 nm, 193 nm, and 157 nm, extreme-ultraviolet (EUV) such as a wavelength of approximately 4 nm to approximately 70 nm such as approximately 13 nm, x-ray, combinations of these, and the like. Various wavelengths of radiation may be used such as 313 nm, 334 nm, 405 nm, and 126 nm, etc., where the sources may be mainly from specific mercury emission lines or specific lasers. For high performance lithography, single wavelength and/or narrow band radiation sources may be used. For less stringent conditions, a broad band multiple wavelength source may be used. The appropriate radiation wavelength may depend on the components of the overall photoresist composition (e.g., the selection of the organic base, photosensitive acid generator (PAG), base (or quencher), surfactant, solvent, etc.).

In step 120, the film is baked after the patternwise imaging (post-imaging bake). The post-imaging baking temperature may less than about 200° C., such as less than about 100° C. for example. In some embodiments, the post-imaging bake is less than about 150° C. The post-imaging bake may deprotect acid labile groups of the polymer within the exposed regions of the photoresist film, regenerating base soluble groups through an acid catalyzed amplification process; thus, post-imaging baking may render the exposed regions of the resist substantially soluble in a base developer. The duration of the baking process following patternwise imaging may be sufficiently long to deprotect acid labile groups in the polymer in the exposed regions of the photoresist while not being sufficiently long as to induce crosslinking of the polymer. For example, the duration of the post imaging bake may be less than about 5 minutes, such as less than about 2 minutes.

In step 125, the film is developed in a base solution, where the base-soluble exposed regions of the film are removed from the film to leave a positive-tone relief pattern remaining from the unexposed regions of the film. The developer may be organic or aqueous based, such as an alkaline aqueous developer, such as tetramethylammonium hydroxide (TMAH) for example.

In step 130, the relief pattern developed in step 125 is exposed to radiation. The relief pattern may be "blanket exposed" where essentially the entire relief pattern is exposed to the radiation in step 130, where the relief pattern is not exposed through a mask. The exposure of step 130 may result in the production of acid by the photosensitive acid generator present in the film, such as in the remaining unexposed regions which comprise the relief pattern developed in step 125. The wavelength of radiation used in step 125 may be the same as or different from the wavelength of radiation used in the patternwise imaging of step 115.

In step 135, the relief pattern is baked after the exposure to radiation of step 130 (post-developing bake). The post-developing bake following the exposure to radiation of step 130 may result in inducing crosslinking in the relief pattern, such as through silanols in the polymer of the composition. The acid-sensitive crosslinking of the relief pattern during the post-developing bake may occur in the presence of an acid generated by the photosensitive acid generator under exposure to radiation in step 130. Such crosslinking may be not limited to silanols, but may also include halosilanes, acetoxysilanes, silylamines, and alkoxysilanes. The duration of the post-development bake may be sufficiently long to allow for crosslinking of the materials in the relief pattern. For example, the duration of the post-development bake may be longer than about 1 hour, such as about 16 hours for example. The post-developing bake temperature may be less than about 200° C., such as less than about 100° C. for example.

In step 140, the relief pattern formed in step 130 is cured. A final curing step at a processing temperature compatible with back-end-of-line (BEOL) requirements may improve the patterned film properties, such as the dielectric constant, without detriment to pattern fidelity. Curing may comprise thermal treatment of the patterned and developed film at a temperature of about 400° C. or greater. Curing may comprise exposing the relief pattern to UV radiation, heat, electron beam irradiation, plasma, or a combination of any of these techniques, such as thermal treatment in combination with UV radiation at a temperature of about 400° C. or greater, for example. The process ends at 145.

One embodiment comprises a method of using a chemically amplified positive-tone photopatternable blend comprising two or more different polymers mixed together, wherein in combination the blend may be patternwise imaged to form a positive-tone relief pattern in the resist which can then be hardened via crosslinking. The polymers may comprise polymers as described above. The method may comprise:

forming a film of the blend on a substrate;

exposing the film to radiation resulting in generating a latent pattern in the film;

baking the film, after said exposing, at a temperature less than about 150° C.;

developing the baked film, resulting in a positive-tone relief pattern remaining from said latent pattern;

baking the positive-tone relief pattern, after said developing, at a temperature greater than about 45° C.; and curing the baked positive-tone relief pattern at a temperature less than about 500° C.

Baking the film may comprise baking at a temperate less than about 90° C. Baking the positive-tone relief pattern may comprise baking at a temperature greater than about 85° C. The latent pattern may comprise a pattern formed from exposed and unexposed regions of the film. Developing the latent pattern may comprise developing the latent pattern in aqueous base solution, wherein exposed regions of the film are removed to leave a positive-tone relief pattern remaining. The developed positive-tone relief pattern may be irradiated prior to baking the positive-tone image. The developed positive-tone image may be simultaneously irradiated and baked prior to said baking the positive-tone image. Curing may comprise crosslinking the polymers in the blend. An interconnect structure may comprise the dielectric materials as described herein.

Where appropriate, the following techniques and equipment were utilized in the examples below: $^1$H and $^{13}$C NMR spectra were obtained at room temperature on an Avance 400 spectrometer. Quantitative $^{13}$C NMR was run at room temperature in acetone-$d_6$ in an inverse-gated $^1$H-decoupled mode using Cr(acac)$_3$ as a relaxation agent on an Avance 400 spectrometer. For polymer composition analysis $^{19}$F NMR (379 MHz) spectra were also obtained using a Bruker Avance 400 spectrometer. Thermo-gravimetric analysis (TGA) was performed at a heating rate of 5° C./min in $N_2$ on a TA Instrument Hi-Res TGA 2950 Thermogravimetric Analyzer. Differential scanning calorimetry (DSC) was performed at a heating rate of 10° C./minute on a TA Instruments DSC 2920 modulated differential scanning calorimeter. Molecular weights were measured using gel permeation chromatography (GPC) in tetrahydrofuran (THF) on a Waters Model 150 chromatograph relative to polystyrene standards. IR spectra were recorded on a Nicolet 510 FT-IR spectrometer on a film cast on a KBr plate. Film thickness was measured on a Tencor alpha-step 2000. A quartz crystal microbalance (QCM) was used to study the dissolution kinetics of the resist films in an aqueous TMAH solution (CD-26). Modulus and hardness data were acquired using a nanoindentation method.

Example 1

Synthesis of Poly(4-Hydroxy-α-Methylbenzylsilsesquioxane-Co-α-Methylbenzylsilsesquioxane) (6:4 pHMBS/MBS)

A mixture of 1-trichlorosilyl-1-(4-acetoxyphenyl)-ethane (223.2 grams; 0.75 mole), 1-trichlorosilyl-1-phenyl-ethane (125.8 grams; 0.525.1 mole), and 389 grams (g) of anhydrous tetrahydrofuran were added drop-wise to a rapidly stirred mixture of triethylamine (307.7 g; 4.2075 mole) and 389 g of deionized water while cooling with an ice bath to maintain the reaction temperature between about 0° C. and about 10° C. After the addition was complete, the mixture was stirred at a temperature between about 0° C. and about 10° C., for one hour. The cooling bath was removed and the mixture was allowed to warm to room temperature and stir for about 20 hours. The reaction mixture was placed in a seperatory funnel and the lower layer was separated and retained. The upper layer was diluted with about 900 milliliters (ml) deionized water and extracted three times with about 450 ml of diethyl ether. The ether extracts were combined with the lower layer retained from the first separation and the ether solution washed four times with about 400 ml of about 2% aqueous hydrochloric acid, and three times with about 300 ml of saturated aqueous NaCl (brine). The ether solution was dried over anhydrous magnesium sulfate, filtered, and evaporated to yield 264.4 g of a hard foam product after drying under high vacuum to constant weight.

A 260 g portion of the dry foam was dissolved in about 260 g of toluene, heated to about 100° C. with stirring, 20 drops of about 50% w/w aqueous potassium hydroxide added, and the mixture heated to reflux under nitrogen while collecting azeotroped water in a Dean-Stark trap. After refluxing the reaction mixture for about 36 hours, the reaction temperature had increased from about 103.8° C. to about 110.4° C. GPC analysis of an aliquot taken from the reaction mixture indicated that the molecular weight was in the range of about 3,000 to about 3,500 grams/mole (g/mol). The reaction mixture was cooled and precipitated in about 10 liters of stirred hexanes, collected on a filter funnel and washed with 3×500 ml of hexanes. After drying to constant weight, about 220 g of solid was obtained.

The solid above was added portion-wise to a stirred mixture of 140 ml of aqueous ammonium hydroxide (12.4 N) in 1120 ml of methanol at about 50° C. The suspension was heated to reflux and became homogenous after about 20 minutes at reflux. The solution was refluxed for about 3 additional hours. The reaction solution was then cooled to about room temperature, and the polymer product was isolated by precipitation in a mixture of about 128.9 g of acetic acid and about 20 liters of deionized water. The solid product was isolated by filtration and washed with three approximately 1 liter portions of deionized water. Drying in a vacuum oven for several days at about 60° C. yielded 179 g of poly(HMBS/MBS) product.

Example 2

Synthesis of Poly(4-tert-butylacetoxy-co-4-hydroxy-α-methylbenzylsilsesquioxane-co-α-methylbenzylsilsesquioxane) (1.2:4.8:4 pBAMBS/HMBS/MBS)

Poly(4-hydroxy-α-methylbenzylsilsesquioxane-co-α-methylbenzylsilsesquioxane) (5.0 g) and tert-butylbromoacetate (1.26 g, 6.5 millimoles) were dissolved in about 30 ml of acetone followed by the addition of $K_2CO_3$ (0.96 g, 6.9 millimoles). The reaction was stirred at ambient temperature for about 16 hours before the polymer was precipitated from about 2% aqueous acetic acid. The precipitate was filtered and dried overnight at about 40° C.

Example 3

Photopatternable Blend Composition

A patternable low-k composition was formulated with 6 g of a 20 weight percent (wt %) solution of 1.2:4.8:4 pBAMBS/HMBS/MBS in propylene glycol monomethyl ether acetate (PGMEA), 4 g of a 20 wt % solution of the silsesquioxane polymer LKD-2056, 0.2 g of a 20 wt % solution of triphenylsulfonium nonaflate in PGMEA, and 0.2 g of a 0.5 wt % solution of a base in PGMEA. The resulting low-k formulation was filtered through a 0.2 micron (μm) filter.

Example 4

Pattern Integrity

The low k composition of Example 3 was spin coated onto an 8 inch silicon wafer and post-applied baked at about 110° C. for about 60 s, patternwise exposed to 248 nm DUV light on an ASML (0.63 NA, ⅝ annular) DUV stepper, and post exposure baked at about 85° C. for about 60 s. This was followed by a 30 s puddle development step with 0.26 N TMAH developer to resolve 0.300 μm line and space features. The imaged wafer was blanket exposed to 248 nm DUV light and heated at about 85° C. for about 16 h to induce crosslinking. The patterned film was subjected to a UV-thermal cure at 400° C. for 1 h under a $N_2$ atmosphere. The resultant film had a dielectric constant of 2.7 at 23° C.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed:

1. A composition comprising:
a polymer blend comprising a first polymer and a second polymer, wherein said first polymer comprises:

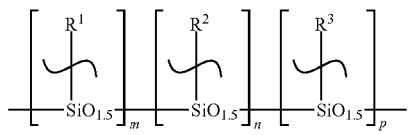

wherein, m and p are integers greater than zero, n is an integer greater than zero, $R^1$ is a carbon functionality having an acid-labile protecting group, $R^3$ is a carbon functionality having at least one carbon atom, wherein $R^2$ is

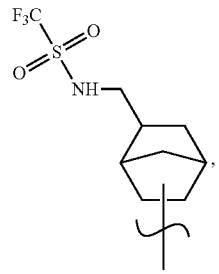

wherein said second polymer comprises:

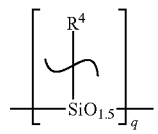

wherein, q is an integer greater than zero and $R^4$ comprises a carbon functional group comprising at least one carbon atom, wherein said second polymer is configured to undergo chemical crosslinking with said first polymer, said second polymer, or a combination thereof, upon exposure to light, thermal energy, or a combination thereof; and
a photosensitive acid generator.

2. The composition of claim 1, wherein $R^3$ is selected from the group consisting of branched alkyls, cycloalkyls, aromatics, arenes, acrylates, and combinations thereof.

3. The composition of claim 2, wherein $R^3$ is selected from the group consisting of

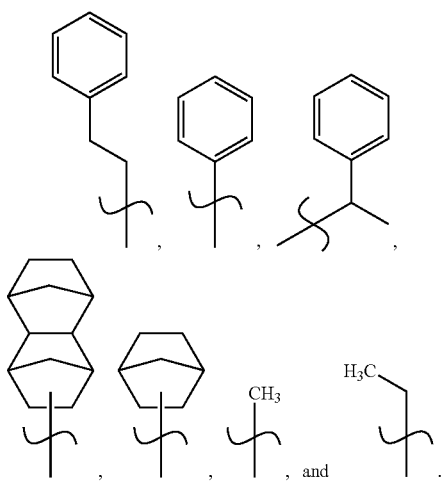

4. The composition of claim 1, wherein $R^1$ is selected from the group consisting of carbonates, tertiary esters, acetals, ketals, and combinations thereof.

5. The composition of claim 1, wherein $R^4$ is selected from the group consisting of alkyls, cycloalkyls, aryls, and combinations thereof.

6. The composition of claim 1, wherein R⁴ is selected from the group consisting of

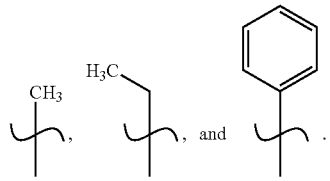

7. The composition of claim 1, wherein said second polymer has a molecular weight between about 400 g/mol and about 500,000 g/mol.

8. The composition of claim 1, wherein said photosensitive acid generator is selected from the group consisting of N-(trifluoromethylsulfonyloxy)-bicyclo[2.2.1]hept-5-ene-2,3-dicarboximide, onium salts, aromatic diazonium salts, sulfonium salts, diaryliodonium salts, sulfonic esters of N-hydroxyamides, sulfonic esters of N-hydroxyimides, N-hydroxynapthalimide, and combinations thereof.

9. The composition of claim 1, wherein said composition further comprises a thermal acid generator capable of generating an acid upon thermal treatment, wherein said thermal acid generator is selected from the group consisting of: 2,4,4,6-tetrabromocyclohexadienone, benzoin tosylate, 2-nitrobenzyl tosylate, alkyl esters of organic sulfonic acids, blocked alkyl phosphoric acids, blocked perfluoroalkyl sulfonic acids, alkyl phosphoric acid complexes, alkyl phosphoric amine complexes, and perfluoroalkyl acids.

10. The composition of claim 1, wherein q is an integer between about 4 and about 50,000.

11. The composition of claim 1, wherein said second polymer is a polysilsesquioxane having end groups selected from the group consisting of silanol, halosilane, acetoxysilane, silylamine, and alkoxysilane.

12. The composition of claim 1, wherein said first polymer has a weight averaged molecular weight in the range from about 400 grams/mole to about 500,000 grams/mole.

13. The composition of claim 1, further comprising an organic base selected from the group consisting of tetraalkylammonium hydroxides, cetyltrimethylammonium hydroxide, 1,8-diaminonaphthalene, and combinations thereof.

14. The composition of claim 1, wherein m, n, and p are each independently in a range from 1 to about 5,000.

15. The composition of claim 1, wherein the weight/weight concentration of said second polymer is in the range from about 5% to about 95% of the total composition.

16. A method of forming a relief pattern on a substrate, comprising:
 forming a film of the composition of claim 1 on the substrate;
 patternwise imaging said film through a mask, wherein at least one region of said film is exposed to radiation, resulting in production of an acid catalyst in said at least one exposed region of said film;
 after said imaging, baking said film, wherein resulting from said baking said at least one exposed region is rendered substantially soluble in a base developer;
 after said baking said film, developing said film in a base solution, resulting in removal of base-soluble exposed regions of said film, wherein a relief pattern from said film remains following said removal;
 exposing said relief pattern to radiation, resulting in production of an acid catalyst in said relief pattern;
 after said exposing, baking said relief pattern, resulting in inducing crosslinking in said relief pattern; and
 curing said relief pattern.

17. The method of claim 16, wherein said curing comprises exposing said relief pattern to UV radiation, heat, electron beam irradiation, plasma, or a combination thereof, wherein said curing is at a temperature greater than about 400° C.

18. The method of claim 16, wherein said baking said film is at a temperature less than about 100° C.

19. The method of claim 16, wherein R¹ is selected from the group consisting of carbonates, tertiary esters, acetals, ketals, and combinations thereof.

20. A composition, comprising:
 a polymer blend comprising a first silsesquioxane polymer and a second silsesquioxane polymer, wherein said first silsesquioxane polymer comprises:

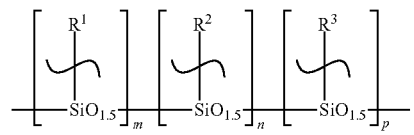

wherein, m, n, and p are integers in a range from 1 to about 5,000, R¹ is

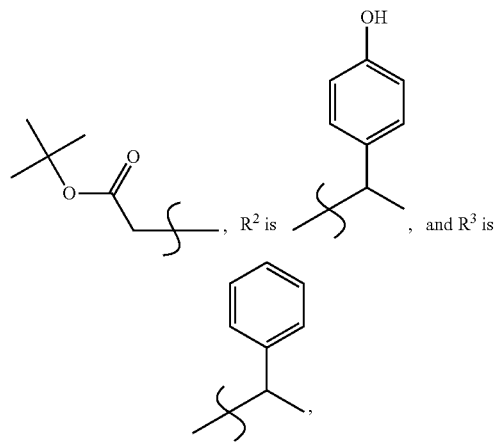

wherein said second silsesquioxane polymer is comprises:

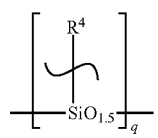

where q is an integer in a range from about 4 to about 50,000,
 where R⁴ is a methyl group, and
 wherein said second polymer is configured to undergo chemical crosslinking with said first polymer, said second polymer, or a combination thereof, upon exposure to light, thermal energy, or a combination thereof;
 an organic base; and
 a photosensitive acid generator.

21. A method of forming a relief pattern on a substrate, comprising:

forming a film of the composition of claim 20 on the substrate;

patternwise imaging said film through a mask, wherein at least one region of said film is exposed to radiation, resulting in production of an acid catalyst in said at least one exposed region of said film;

after said imaging, baking said film, wherein resulting from said baking said at least one exposed region is rendered substantially soluble in a base developer;

after said baking said film, developing said film in a base solution, resulting in removal of base-soluble exposed regions of said film, wherein a relief pattern from said film remains following said removal;

exposing said relief pattern to radiation, resulting in production of an acid catalyst in said relief pattern;

after said exposing, baking said relief pattern, resulting in inducing crosslinking in said relief pattern; and curing said relief pattern.

22. A method of using a chemically amplified positive-tone photopatternable blend, said method comprising:

forming a film of said blend on a substrate, said blend comprising at least two different polymers mixed together, wherein in combination said at least two different polymers are capable of being positively imaged resulting in forming a relief pattern capable of being hardened via crosslinking;

exposing said film to radiation, resulting in generating a latent pattern in said film;

baking said film, after said exposing, at a temperature less than about 150° C.;

developing said baked film, resulting in a positive-tone relief pattern remaining from said latent pattern;

baking said positive-tone relief pattern, after said developing, at a temperature greater than about 45° C.; and curing said baked positive-tone relief pattern at a temperature less than about 500° C., wherein said blend comprises a first silsesquioxane polymer and a second silsesquioxane polymer, wherein said first silsesquioxane polymer comprises:

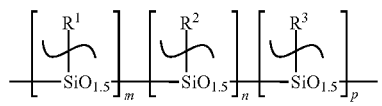

wherein, m, n, and p are integers in a range from 1 to about 5,000, $R^1$ is

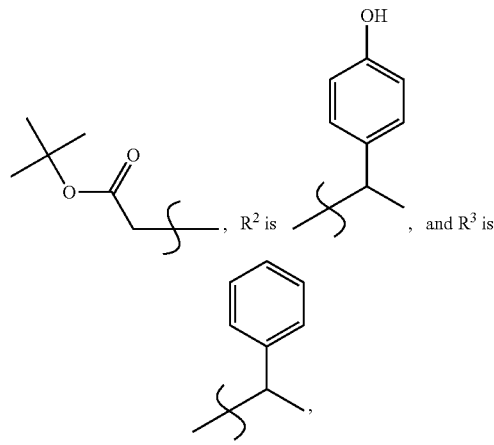

, $R^2$ is , and $R^3$ is wherein said second silsesquioxane polymer is comprises:

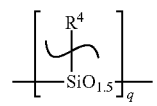

wherein q is an integer in a range from about 4 to about 50,000, and where $R^4$ is a methyl group.

23. The method of claim 22, wherein the dielectric constant of said blend is less than about 3.0 after curing said blend above about 400° C.

24. The method of claim 22, wherein each polymer of said at least two different polymers constitutes at least 5 weight percent of said blend.

* * * * *